United States Patent
Hao et al.

(10) Patent No.: US 9,886,889 B2
(45) Date of Patent: Feb. 6, 2018

(54) SHIFT REGISTER UNIT, GATE DRIVING CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Xueguang Hao, Beijing (CN); Xiangdong Wei, Beijing (CN); Seong Jun An, Beijing (CN); Bongyeol Ryu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 246 days.

(21) Appl. No.: 14/429,473

(22) PCT Filed: Jun. 20, 2014

(86) PCT No.: PCT/CN2014/080459
§ 371 (c)(1),
(2) Date: Mar. 19, 2015

(87) PCT Pub. No.: WO2015/100967
PCT Pub. Date: Jul. 9, 2015

(65) Prior Publication Data
US 2016/0027371 A1    Jan. 28, 2016

(30) Foreign Application Priority Data
Dec. 31, 2013    (CN) .......................... 2013 1 0749863

(51) Int. Cl.
G09G 3/20      (2006.01)
G11C 19/28     (2006.01)
G09G 3/36      (2006.01)

(52) U.S. Cl.
CPC ......... *G09G 3/2092* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS

2006/0071923 A1    4/2006  Lee et al.
2008/0048712 A1    2/2008  Ahn et al.
(Continued)

FOREIGN PATENT DOCUMENTS

CN    1755765 A      4/2006
CN    103236273 A    8/2013
(Continued)

OTHER PUBLICATIONS

Second Chinese Office Action dated Feb. 24, 2016; Appln. No. 201310749863.4.
(Continued)

*Primary Examiner* — Amare Mengistu
*Assistant Examiner* — Sarvesh J Nadkarni
(74) *Attorney, Agent, or Firm* — Ladas & Parry LLP (57) ABSTRACT

There provide a shift register unit, a gate driving circuit and a display device. The shift register unit includes an input module, an output module, a pulling-down driving module, a pulling-down module and a resetting module. The input module is connected to a first input signal terminal, a first direct current signal terminal, a second input signal terminal and a second direct current signal terminal respectively. The
(Continued)

output module is connected to a first clock signal terminal. The pulling-down driving module is connected to the first clock signal terminal, a second clock signal terminal and a low voltage signal terminal. The pulling-down module is connected to the low voltage signal terminal. The resetting module is connected to the second clock signal terminal and the low voltage signal terminal respectively. The noise of the shift register unit can be reduced and the stability of the shift register unit can be enhanced.

18 Claims, 6 Drawing Sheets

(52) U.S. Cl.
CPC .............. *G09G 2300/0408* (2013.01); *G09G 2310/0283* (2013.01); *G09G 2310/0286* (2013.01); *G09G 2310/08* (2013.01); *G09G 2320/04* (2013.01)

(56) References Cited

U.S. PATENT DOCUMENTS

| | | |
|---|---|---|
| 2011/0228893 A1 | 9/2011 | Tobita et al. |
| 2013/0088265 A1* | 4/2013 | Chen .................... H03K 5/153 327/108 |

FOREIGN PATENT DOCUMENTS

| | | |
|---|---|---|
| CN | 103366704 A | 10/2013 |
| CN | 103680636 A | 3/2014 |

OTHER PUBLICATIONS

First Chinese Office Action dated Nov. 26, 2015; Appln. No. 201310749863.4.
International Search Report Appln. No. PCT/CN2014/080459; dated Sep. 30, 2014.
Written Opinion of the International Searching Authority Appln. No. PCT/CN2014/080459; dated Sep. 30, 2014.

* cited by examiner

SHIFT REGISTER UNIT, GATE DRIVING CIRCUIT AND DISPLAY DEVICE

TECHNICAL FIELD

The present disclosure relates to a shift register unit, a gate driving circuit and a display device.

BACKGROUND

A liquid crystal panel adopts a progressive scanning matrix of M×N dot arrangement to display. A thin film transistor-liquid crystal display (TFT-LCD) driver comprises mainly a gate driver and a data driver, wherein the gate driver makes the input clock signal converted by the shift register and then applies the converted input clock signal to a gate line of the liquid crystal display panel.

The shift register is used generally in the gate driver of the liquid crystal display panel. Each of gate lines is correspondingly connected to a stage of circuit unit of the shift register. A gate input signal is output through the gate driving circuit to progressively scan respective pixels. The gate driving circuit can be disposed in the display panel by means of an encapsulation mode of chip on array (COA) technique on a flexible substrate or chip on glass (COG) technique on a glass substrate, or can be formed in the display panel through composing an integrated circuit unit by TFTs. For the liquid crystal display panel, the design that the gate driver is integrated on the gate on array (GOA) can reduce the product cost and also subtracts a process therefrom, so as to raise the productivity.

The patent application number 200510106997.X discloses a shift register unit, but the gate driving circuit composed of the shift register unit has high power consumption, and is easy to produce noise.

SUMMARY

According to one aspect of the present disclosure, there is provided a shift register unit, comprising:

an input module connected to a first input signal terminal, a first direct current signal terminal, a second input signal terminal and a second direct current signal terminal respectively, and configured to provide a first input signal received by the first input signal terminal to a pulling-up node according to a first direct current signal received by the first direct current signal terminal, and provide a second input signal received by the second input signal terminal to the pulling-up node according to a second direct current signal received by the second direct current signal terminal;

an output module connected to a first clock signal terminal and configured to provide a first clock signal received by the first clock signal terminal to an output terminal according to a voltage signal of the pulling-up node;

a pulling-down driving module connected to the first clock signal terminal, a second clock signal terminal and a low voltage signal terminal, and configured to provide a second clock signal received by the second clock signal terminal to a pulling-down node according to the first clock signal received by the first clock signal terminal and the second clock signal, and provide a low voltage signal received by the low voltage signal terminal to the pulling-down node according to the voltage signal of the pulling-up node;

a pulling-down module connected to the low voltage signal terminal and configured to provide the low voltage signal received by the low voltage signal terminal to the pulling-up node and the output terminal according to the voltage signal of the pulling-down node;

a resetting module connected to the second clock signal terminal and the low voltage signal terminal respectively, and configured to provide the low voltage signal received by the low voltage signal terminal to the output terminal according to the second clock signal received by the second clock signal terminal, wherein the pulling-up node is a connecting point of the input module and the output module, and the pulling-down driving module is connected to the pulling-down module through the pulling-down node.

Alternatively, the input module comprises a first transistor, a second transistor, a third transistor and a fourth transistor. A gate and a source of the first transistor are connected to the first input signal terminal. A drain of the second transistor is connected to the source of the first transistor, a gate thereof is connected to the first direct current signal terminal, and a source thereof is connected to the pulling-up node. A gate and a source of the third transistor are connected to the second input signal terminal, and a drain thereof is connected to the pulling-up node. A source of the fourth transistor is connected to the drain of the third transistor, a gate thereof is connected to the second direct current signal terminal, and a drain thereof is connected to the pulling-up node.

Alternatively, the output module comprises a fifth transistor and a first capacitor. A gate of the fifth transistor is connected to the pulling-up node, a drain thereof is connected to the first clock signal terminal, and a source thereof is connected to the output terminal. One terminal of the first capacitor is connected to the pulling-up node, and another terminal of the first capacitor is connected to the low voltage signal terminal or the output terminal.

Alternatively, the pulling-down driving module comprises a sixth transistor, a seventh transistor, an eighth transistor, a ninth transistor and a second capacitor. A gate and a drain of the seventh transistor are connected to the first clock signal terminal, and a source thereof is connected to a gate of the ninth transistor. A drain of the ninth transistor is connected to the second clock signal terminal, and a source thereof is connected to a source of the eighth transistor. A gate of the eighth transistor is connected to the second clock signal terminal, and the drain thereof is connected to the pulling-down node. A gate of the sixth transistor is connected to the pulling-up node, a drain thereof is connected to the pulling-down node, and a source thereof is connected to the low voltage signal terminal. One terminal of the second capacitor is connected to the low voltage signal terminal, and another terminal thereof is connected to the source of the seventh transistor.

Alternatively, the pulling-down module comprises a tenth transistor and an eleventh transistor. A drain of the tenth transistor is connected to the low voltage signal terminal, a source thereof is connected to the pulling-up node, and a gate thereof is connected to the pulling-down node. A gate of the eleventh transistor is connected to the pulling-down node, a source thereof is connected to the low voltage signal terminal, and a drain thereof is connected to the output terminal.

Alternatively, the resetting unit comprises a twelfth transistor. A gate of the twelfth transistor is connected to the second clock signal terminal, a drain thereof is connected to the low voltage signal terminal, and a source thereof is connected to the output terminal.

Alternatively, the first direct current signal has a phase opposite to that of the second direct current signal.

Alternatively, the first clock signal has a phase opposite to that of the second clock signal.

According to another aspect of the present disclosure, there is provided a gate driving circuit comprising multiple stages of shift register units described above. Except for a first stage of shift register unit and a last stage of shift register unit, a first input signal of each stage of shift register is connected to an output terminal of an adjacent previous stage of shift register unit, a second input signal of each sage of shift register unit is connected to an output terminal of an adjacent next shift register unit, and an output terminal of each stage of shift register unit is connected to a second input signal terminal of the adjacent previous stage of shift register unit and a first input signal terminal of the adjacent next stage of shift register unit.

According to another aspect of the present disclosure, there is further provided a display device comprising the gate driving circuit described above.

The present disclosure pulls down a potential at the pulling-up node through the pulling-down module. The pulling-down module keeps in an operation state before the next frame starts, thereby effectively avoiding the pulling-up node in a non-operation state from producing noise. The present disclosure pulls down the potential at the output terminal in the non-operation state through the pulling-down module and the resetting module, thereby effectively avoiding noise of the output terminal. The present disclosure enables each high level signal of the second clock signal to pull up the potential at the pulling-down node through the pulling-down driving mode, thereby reducing power consumption of the whole circuit and avoiding the pulling-down node from producing noise.

DETAILED DESCRIPTION

Specific implementations of the present disclosure will be further described in detail by combining with the accompanying figures and embodiments. The following embodiments are used for describing the present disclosure, but not for limiting the scope of the present disclosure.

Figure 1:
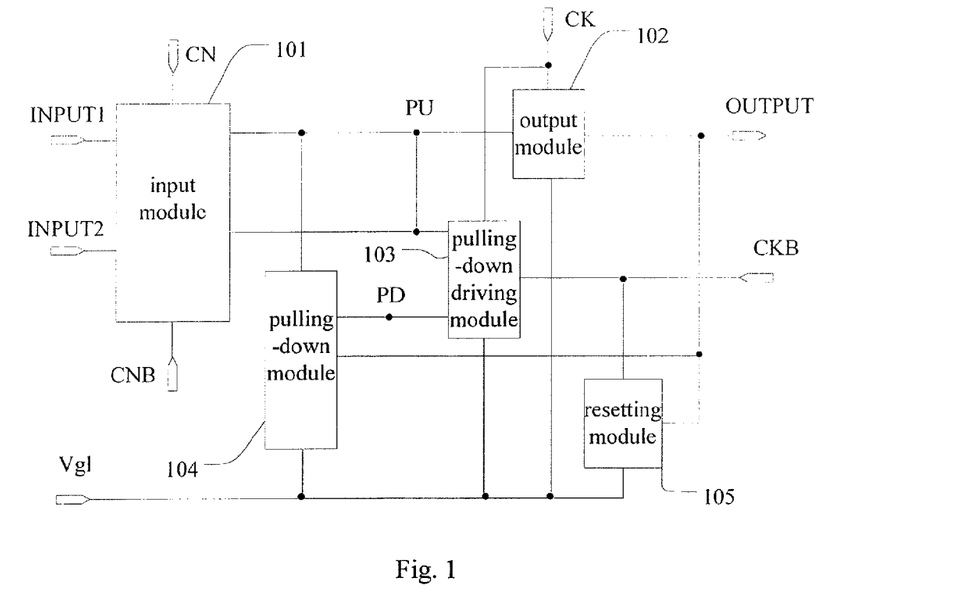
FIG. 1 is a schematic diagram of a shift register unit provided in an implementation of the present disclosure.

FIG. 1 is a schematic diagram of a shift register unit provided in an implementation of the present disclosure, comprising an input module 101, an output module 102, a pulling-down driving module 103, a pulling-down module 104 and a resetting module 105.

As shown in FIG. 1, the input module 101 is connected to a first input signal terminal INPUT1, a first direct current signal terminal CN, a second input signal terminal INPUT2 and a second direct current signal terminal CNB respectively, and is configured to provide a first input signal received by the first input signal terminal INPUT1 to a pulling-up node PU according to a first direct current signal received by the first direct current signal terminal CN, and provide a second input signal received by the second input signal terminal INPUT2 to the pulling-up node PU according to a second direct current signal received by the second direct current signal terminal INPUT2. The pulling-up node PU is a connecting point of the input module 101 and the output module 102.

The output module 102 is connected to a first clock signal terminal CK, and configured to provide a first clock signal received by the first clock signal terminal CK to an output terminal OUTPUT according to a voltage signal of the pulling-up node PU.

The pulling-down driving module 103 is connected to the first clock signal terminal CK, a second clock signal terminal CKB and a low voltage signal terminal Vg1, and configured to provide a second clock signal received by the second clock signal terminal CKB to a pulling-down node PD according to the first clock signal received by the first clock signal terminal CK and the second clock signal, and provide a low voltage signal received by the low voltage signal terminal Vg1 to the pulling-down node PD according to the voltage signal of the pulling-up node PU. The pulling-down driving module 103 is connected to the pulling-down module 104 through the pulling-down node PD.

The pulling-down module 104 is connected to the low voltage signal terminal Vg1, and configured to provide the low voltage signal received by the low voltage signal terminal Vg1 to the pulling-up node PU and the output terminal OUTPUT according to the voltage signal of the pulling-down node PD.

The resetting module 105 is connected to the second clock signal terminal CKB and the low voltage signal terminal Vg1 respectively, and configured to provide the low voltage signal received by the low voltage signal terminal Vg1 to the output terminal OUTPUT according to the second clock signal received by the second clock signal terminal CKB.

Figure 2:
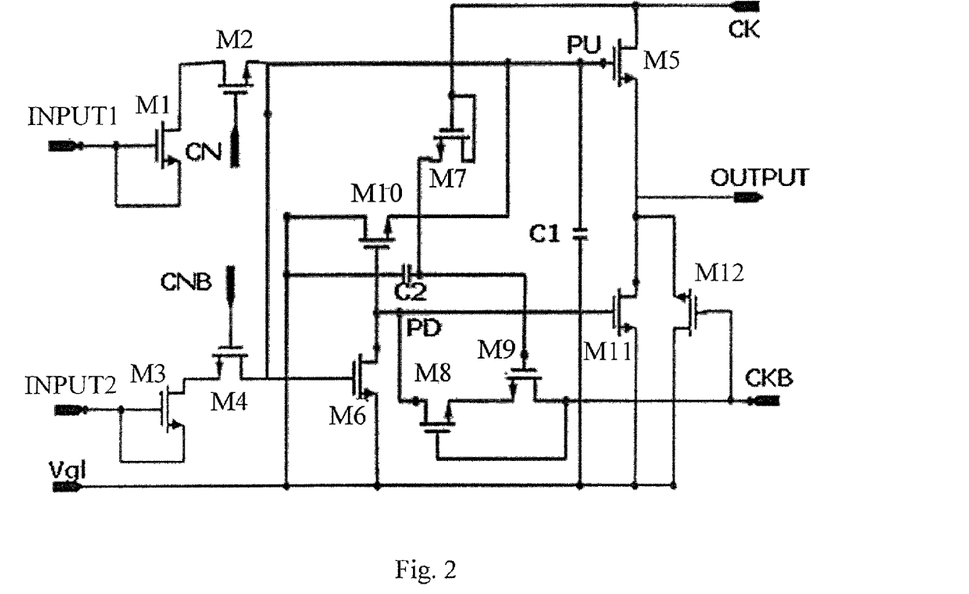
FIG. 2 is a schematic diagram of another shift register unit provided in an implementation of the present disclosure.

FIG. 2 is a schematic diagram of another shift register unit provided in an implementation of the present disclosure. Referring to FIG. 2, the input module 101 comprises a first transistor M1, a second transistor M2, a third transistor M3 and a fourth transistor M4.

A gate and a source of the first transistor M1 are connected to the first input signal terminal INPUT1. A drain of the second transistor M2 is connected to the drain of the first transistor M1, a gate thereof is connected to the first direct current signal terminal CN, and a source thereof is connected to the pulling-up node PU. A gate and a source of the third transistor M3 are connected to the second input signal terminal INPUT2, and a drain thereof is connected to the pulling-up node PU. A source of the fourth transistor M4 is connected to the drain of the third transistor M3, a gate thereof is connected to the second direct current signal terminal CNB, and a drain thereof is connected to the pulling-up node PU.

In FIG. 2, the output module 102 comprises a fifth transistor M5 and a first capacitor C1.

A gate of the fifth transistor M5 is connected to the pulling-up node PU, a drain thereof is connected to the first clock signal terminal CK, and a source thereof is connected to the output terminal OUTPUT. One terminal of the first capacitor C1 is connected to the pulling-up node PU, and another terminal of the first capacitor C1 is connected to the low voltage signal terminal Vg1 or the output terminal OUTPUT (not shown).

Further, the pulling-down driving module 103 comprises a sixth transistor M6, a seventh transistor M7, an eighth transistor M8, a ninth transistor M9 and a second capacitor C2.

A gate and a drain of the seventh transistor M7 are connected to the first clock signal terminal CK, and a source of the seventh transistor M7 is connected to a gate of the ninth transistor M9. A drain of the ninth transistor M9 is connected to the second clock signal terminal CKB, and a source of the ninth transistor M9 is connected to a source of the eighth transistor M8. A gate of the eighth transistor M8 is connected to the second clock signal terminal CKB, and the drain thereof is connected to the pulling-down node PD. A gate of the sixth transistor M6 is connected to the pulling-up node PU, a drain thereof is connected to the pulling-down node PD, and a source thereof is connected to the low voltage signal terminal Vg1. One terminal of the second capacitor C2 is connected to the low voltage signal terminal Vg1, and another terminal thereof is connected to the source of the seventh transistor M7.

It needs to note that the structure of the pulling-down driving module is just an embodiment, and is not used to limit the specific structure of the pulling-down driving module. Also, the pulling-down driving module may not comprise the second capacitor C2.

As shown in FIG. 2, the pulling-down module 104 comprises a tenth transistor M10 and an eleventh transistor M11.

A drain of the tenth transistor M10 is connected to the low voltage signal terminal Vg1, a source thereof is connected to the pulling-up node PU, and a gate thereof is connected to the pulling-down node PD.

A gate of the eleventh transistor M11 is connected to the pulling-down node PD, a source thereof is connected to the low voltage signal terminal Vg1, and a drain thereof is connected to the output terminal OUTPUT.

Further, the resetting unit 105 comprises a twelfth transistor M12. A gate of the twelfth transistor M12 is connected to the second clock signal terminal CKB, a drain thereof is connected to the low voltage signal terminal Vg1, and a source thereof is connected to the output terminal OUTPUT Further, it needs to note that for transistors in the liquid crystal display field, there is no specific distinction between drains and sources. Therefore, the sources of transistors mentioned in the embodiments of the present disclosure can be drains of the transistors, and the drains of the transistors can also be the sources of the transistors.

Alternatively, the first direct current signal has a phase opposite to the second direct current signal.

Alternatively, the first clock signal has a phase opposite to the second clock signal. For example, if the first clock signal is CK, then the second clock signal is CKB; if the first clock signal is CKB, then the second clock signal is CK.

The shift register unit provided in the implementation of the present disclosure pulls down a potential at the pulling-up node through the pulling-down module. The pulling-down module keeps in an operation state before the next frame starts, thereby effectively avoiding the pulling-up node in a non-operation state from producing the noise. The shift register unit pulls down the potential at the output terminal in the non-operation state through the pulling-down module and the resetting module, thereby effectively avoiding the output terminal from producing the noise. The shift register unit enables each high level signal of the second clock signal to pull up the potential at the pulling-down node through the pulling-down driving module, thereby reducing the power consumption of the whole circuit and avoiding pulling-down node from producing the noise.

Figure 3:
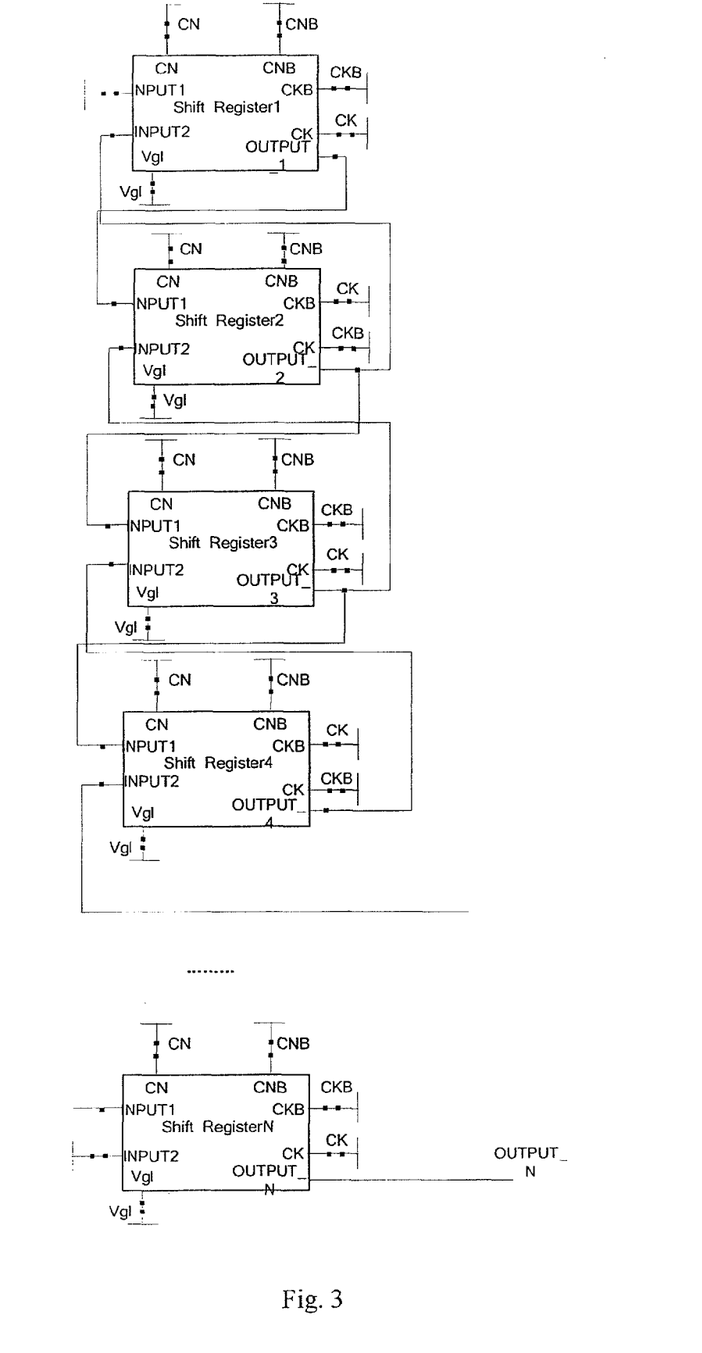
FIG. 3 is a schematic diagram of a structure of a gate driving circuit provided in an implementation of the present disclosure.

In addition, FIG. 3 is a schematic diagram of a structure of a gate driving circuit provided in an implementation of the present disclosure. Referring to FIG. 3, the gate driving circuit comprises multiple stages of any shift register units described above. Except for a first stage of shift register unit and a last stage of shift register unit, a first input signal of each stage of shift register is connected to an output terminal of an adjacent previous stage of shift register unit, a second input signal of each sage of shift register unit is connected to an output terminal of an adjacent next shift register unit, and an output terminal of each stage of shift register unit is connected to a second input signal terminal of the adjacent previous stage of shift register unit and a first input signal terminal of the adjacent next stage of shift register unit. Herein, when forward scanning, a first input terminal INPUT1 of the first stage of shift register unit inputs a start signal STV, and a second input terminal INPUT2 of the last stage of shift register unit separately inputs a resetting signal or adds a virtual shift register unit to reset the last stage of shift register unit. When backward scanning, the second input terminal INPUT2 of the last stage of shift register unit inputs the start signal STV, the first input terminal INPUT1 of the first stage of shift register unit separately inputs a resetting signal or adds a virtual shift register unit to reset the first stage of shift register unit.

For example, the gate driving circuit can comprise N stages of shift register units, wherein an output terminal of the (N−1)-th stage can be connected to a first input signal terminal of the N-th stage, and the output terminal of the N-th stage can be connected to a first input signal terminal of the (N−1)-th stage, where N is related to resolution of products. For the two adjacent shift register units, phases of clock signals received by the first clock signal terminal are opposite. For example, if a first clock signal received by a first clock signal terminal of a second stage of shift register is CKB, and a second clock signal received by a second clock signal terminal thereof is CK, then a first clock signal received by a first clock signal terminal of a third stage of shift register is CK, and a second clock signal received by the second clock signal terminal thereof is CKB.

Figure 4:
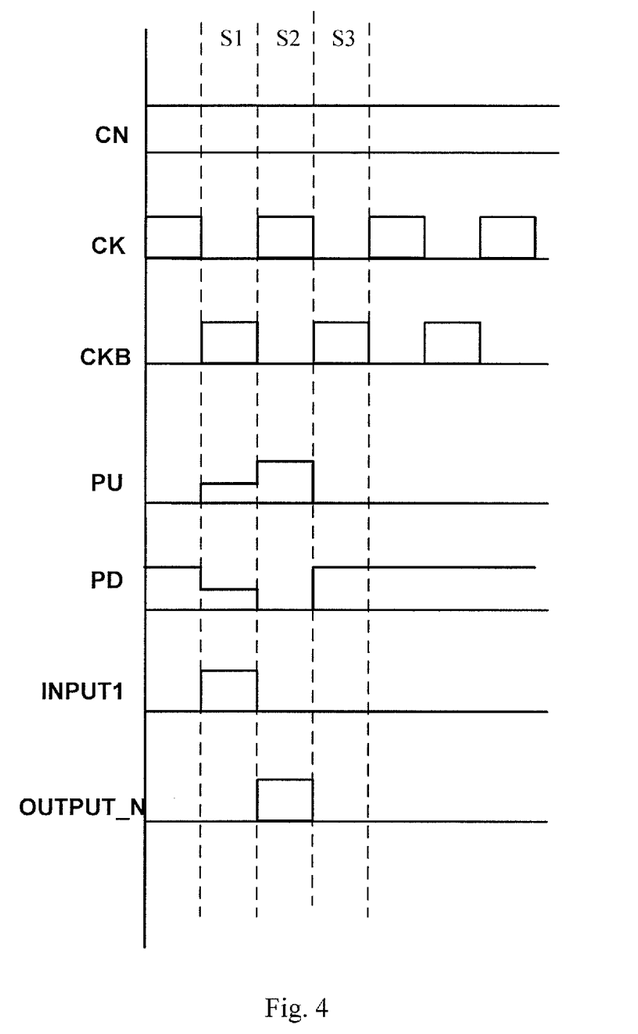
FIG. 4 is a timing diagram of a shift register unit provide in an implementation of the present disclosure.

In order to further describe the shift register unit provided in the implementation of the present disclosure, an operation principle of the N-th stage of shift register unit in the gate diving circuit provided in the implementation of the present disclosure will be described by combining with a timing diagram as shown in FIG. 4. FIG. 4 is a timing diagram of the N-th stage of shift register unit in the gate driving unit.

When forward scanning, referring to FIG. 4, in a first phase S1, the first direct current signal terminal CN, the first input signal terminal INPUT1 and the second clock signal terminal CKB are at the high level, and thus the first transistor M1 and the second transistor M2 are turned on, the potential at the pulling-up node PU rises, C1 is charged, the sixth transistor M6 is turned on, and the potential at the pulling-down node PD is pulled down. Since the first clock signal terminal CK outputs a low level and M12 is in a turn-on state, the output terminal OUTPUT_N outputs a low level;

In a second phase S2, the first clock signal terminal CK is at the high level, transistors M7 and M9 are turned on, and C2 is charged. Due to the effect of C1, the potential at the pulling-up node PU continuously rises, so that M6 and M5 continue to be in the turn-on state and the potential at the node PD is continuously pulled down. The potential at the node PD is related to M6, M8 and M9, and an adjustment of size proportion of M6 and M8, M9 will influence voltage at the step of the node PD. At this time, the output terminal OUTPUT_N of the N-th stage of shift register unit outputs the high level;

In a third phase S3, the second clock signal terminal CKB is at the high level, and thus M8 is turned on. Due to the effect of the capacitor C2, M9 is turned on, and thus the potential at the node PD rises, M10 is turned on, and the potential at the node PU is pulled down. Since M11 and M12 are turned on, OUTPUT_N outputs the low level.

Herein, before a frame starts, since each high level signal at the second clock signal terminal CKB pulls up the potential at the node PD, M10 and M11 keep in the turn-on state and signals at the node PU and OUTPUT_N are pulled down, so as to effectively avoid noise from producing.

Figure 5:
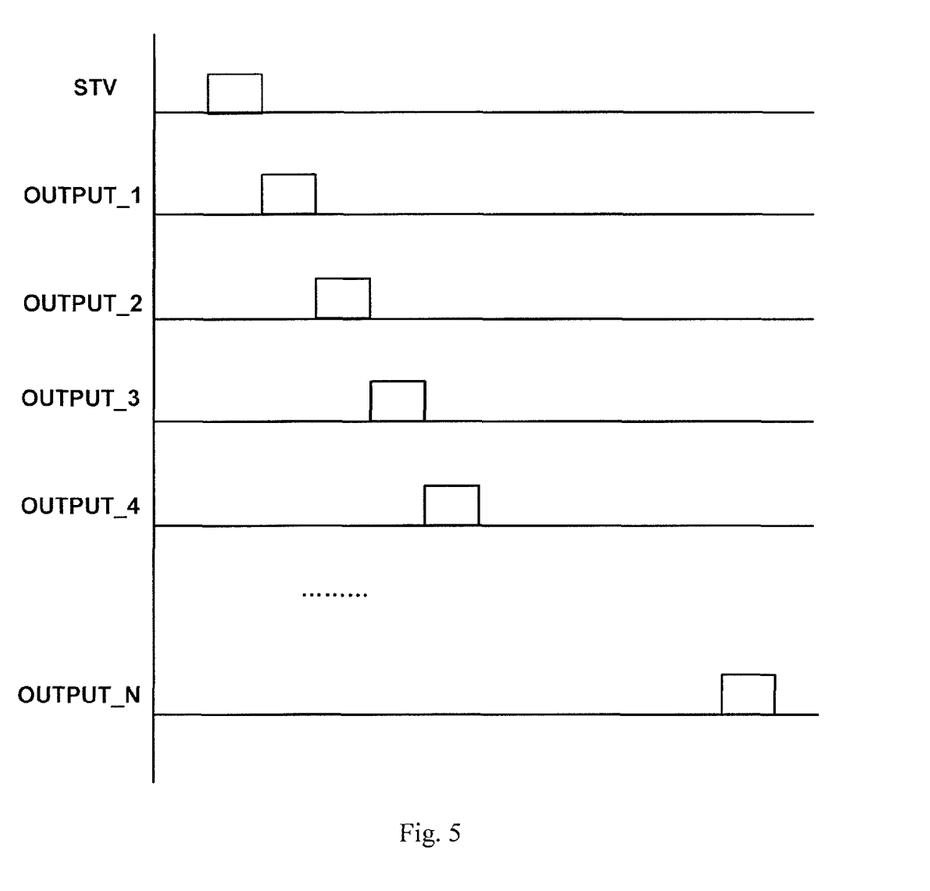
FIG. 5 is a schematic diagram of output waveforms of respective shift register units in a gate driving circuit provided in an implementation of the present disclosure.

When forward scanning, output waveforms of respective shift register units in the gate driving circuit are as shown in FIG. 5.

Figure 6:
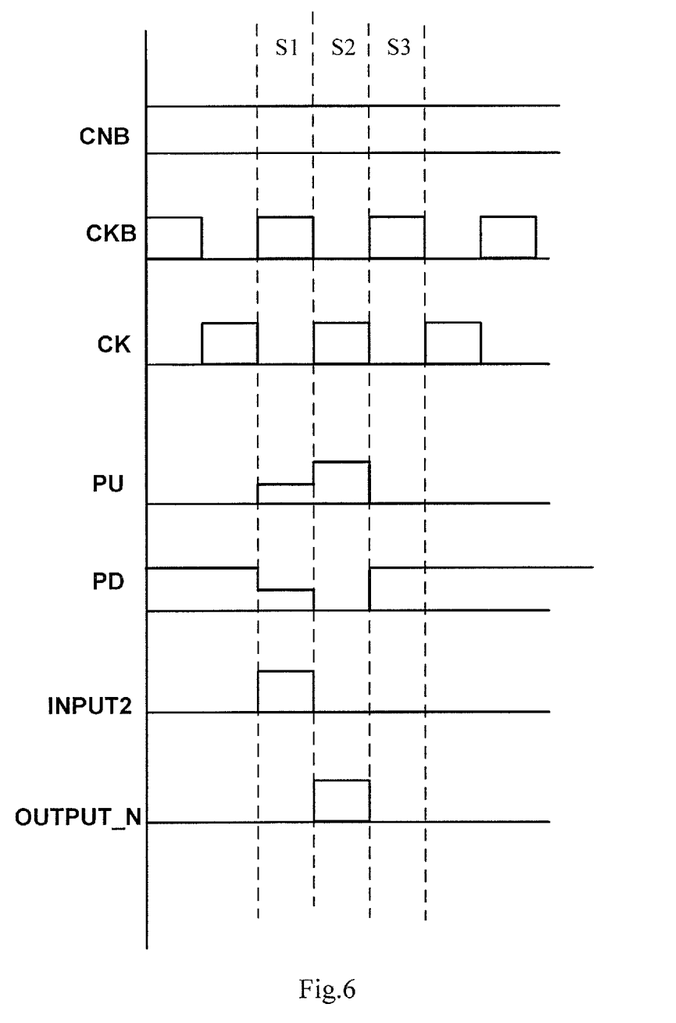
FIG. 6 is a timing diagram of another shift register unit provided in an implementation of the present disclosure.

When backward scanning, referring to FIG. 6, FIG. 6 is a timing diagram of the N-th stage of shift register unit in the gate driving circuit.

In the first phase, the second direct current signal terminal CNB, the second input signal terminal INPUT2, and the second clock signal terminal CKB are at the high level, and thus M3 and M4 are turned on, the voltage at the node PU rises, C1 is charged, M6 is turned on, and the potential at the node PD is pulled down. Since CK outputs the low level and M12 is in the turn-on state, OUTPUT_N outputs the low level.

In the second phase, the first clock signal terminal CK is at the high level, and thus M7 and M9 are turned on, and C2 is charged. Due to the effect of C1, the potential at the node PU continuously rises, so that M6 and M5 continues to be in the turn-on state, and the potential at the node PD continues to be pulled down. The potential at the node PD is related to M6, M8 and M9, and an adjustment of size proportion of M6 and M8, M9 will influence the voltage at the step of node PD. At this time, OUTPUT_N outputs the high level;

In the third phase, the second clock signal terminal CKB is at the high level, and thus M8 is turned on. Due to the effect of C2, M9 is turned on, and thus the potential at the node PD rises, M10 is turned on, the potential at the node PU is pulled down, and M6 and m5 are turned off. Since M11 and M12 are turned on, OUTPUT_N outputs the low level.

Herein, before a frame starts, each high level signal at CKB pulls up the potential at the node PD, so that M10 and M12 keep in the turn-on state, and signals at the node PU and OUTPUT_N are always pulled down, so as to effectively avoid noise from producing.

Figure 7:
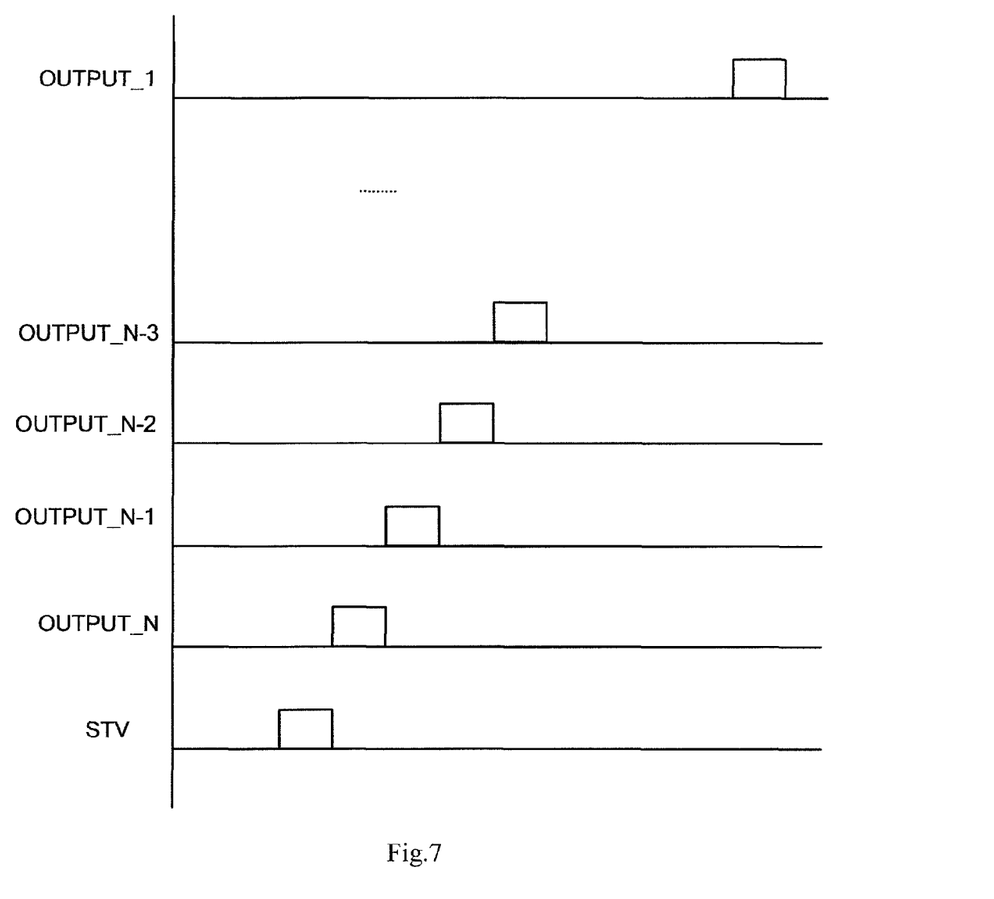
FIG. 7 is a schematic diagram of output waveforms of respective shift register units in another gate driving circuit provided in an implementation of the present disclosure.

When backward scanning, output waveforms of respective shift register units in the gate driving circuit are as shown in FIG. 7.

The gate driving circuit provided in the implementation of the present disclosure enables the gate driving circuit to have the function of bilateral scanning through the third transistor M3, the fourth transistor M4 and the second transistor M2, which satisfies the requirement of customers better. The gate driving circuit pulls down the potential at the pulling-up node PU through the tenth transistor M10 and the eleventh transistor M11, and before the next frame starts, the tenth transistor M10 and the eleventh transistor M11 keep in the turn-on state, which effectively avoid the noise at the node PU from producing in the non-operation state. The gate driving circuit pulls down the potential at the output terminal in the non-operation state through the eleventh transistor M11 and twelfth transistor M12, which effectively avoids the noise of the output terminal. The gate driving circuit enables each high level signal of the second clock signal CKB to pull up the potential at the node PD through the design of the second capacitor C2, which reduces the power consumption of the entire circuit and avoids the noise at the pulling-down PD from producing. At the same time, in the gate driving circuit, through an arrangement of a whole device and a flexible combination of signals, it realizes that the entire gate driving circuit adopts the same shift register unit, thus greatly reducing the difficulty in the gate driving circuit layout (GOA layout).

In addition, the embodiment of the present disclosure further provides a display device comprising the gate driving circuit described above. The display device may be any produce or means having a display function, such as a liquid crystal panel, an electronic paper, a cell phone, a tablet computer, a TV set, a display, a notebook computer, a digital photo frame, a navigator and so on.

The above implementations are just used for describing the present disclosure but not for limiting the present disclosure. Those skilled in the related art can make various alternations and modifications without departing the spirit and scope of the present disclosure. Therefore, all equivalent technical solution also fall into the scope of the present disclosure. The patent protection scope of the present disclosure shall be defined by the claims.

The present application claims the priority of Chinese Patent Application No. 201310749863.4 filed on Dec. 31, 2013, the full text of which is incorporated herein as part of the present disclosure by reference.

What is claimed is:

1. A shift register unit, comprising:
an input sub-circuit connected to a first input signal terminal, a first direct current signal terminal, a second input signal terminal and a second direct current signal terminal respectively, and configured to provide a first input signal received by the first input signal terminal to a pulling-up node according to a first direct current signal received by the first direct current signal terminal, and provide a second input signal received by the second input signal terminal to the pulling-up node according to a second direct current signal received by the second direct current signal terminal;
an output sub-circuit connected to a first clock signal terminal, and configured to provide a first clock signal received by the first clock signal terminal to an output terminal according to a voltage signal of the pulling-up node;
a pulling-down driving sub-circuit connected to the first clock signal terminal, a second clock signal terminal and a low voltage signal terminal, and configured to provide a second clock signal received by the second clock signal terminal to a pulling-down node according to the first clock signal received by the first clock signal terminal and the second clock signal, and provide a low voltage signal received by the low voltage signal terminal to the pulling-down node according to the voltage signal of the pulling-up node;
a pulling-down sub-circuit connected to the low voltage signal terminal, and configured to provide the low voltage signal received by the low voltage signal terminal to the pulling-up node and the output terminal according to the voltage signal of the pulling-down node;

a resetting sub-circuit connected to the second clock signal terminal and the low voltage signal terminal respectively, and configured to provide the low voltage signal received by the low voltage signal terminal to the output terminal according to the second dock signal received by the second dock signal terminal, wherein the pulling-up node is a connecting point of the input sub-circuit and the output sub-circuit, and the pulling-down driving sub-circuit is connected to the pulling-down sub-circuit through the pulling-down node, and wherein the input sub-circuit comprises a first transistor, a second transistor, a third transistor and a fourth transistor;

a gate and a source of the first transistor are connected to the first input signal terminal;

a drain of the second transistor is connected to a drain of the first transistor, a gate thereof is connected to the first direct current signal terminal, and a source thereof is connected to the pulling-up node;

a gate and a source of the third transistor are connected to the second input signal terminal, and a drain thereof is connected to the pullinq-up node; and a source of the fourth transistor is connected to the drain of the third transistor, a gate thereof is connected to the second direct current signal terminal, and a drain thereof is connected to the pulling-up node.

2. The shift register unit according to claim 1, wherein the output sub-circuit comprises a fifth transistor and a first capacitor;

a gate of the fifth transistor is connected to the pulling-up node, a drain thereof is connected to the first dock signal terminal, and a source thereof is connected to the output terminal; and one terminal of the first capacitor is connected to the pulling-up node, and another terminal of the first capacitor is connected to the low voltage signal terminal or the output terminal.

3. The shift register unit according to claim 2, wherein the pulling-down driving sub-circuit comprises a sixth transistor, a seventh transistor, an eighth transistor, a ninth transistor and a second capacitor;

a gate and a drain of the seventh transistor are connected to the first dock signal terminal, and a source thereof connected to a gate of the ninth transistor;

a drain of the ninth transistor is connected to the second dock signal terminal, and a source thereof is connected to a source of the eighth transistor;

a gate of the eighth transistor is connected to the second dock signal terminal, and the drain thereof is connected to the pulling-down node;

a gate of the sixth transistor is connected to the puffing-up node, a drain thereof is connected to the pulling-down node, and a source thereof is connected to the low voltage signal terminal; and one terminal of the second capacitor is connected to the low voltage signal terminal, and another terminal thereof is connected to the source of the seventh transistor.

4. The shift register unit according to claim 3, wherein the pulling-down sub-circuit comprises a tenth transistor and an eleventh transistor;

a drain of the tenth transistor is connected to the low voltage signal terminal, a source thereof is connected to the pulling-up node, and a gate thereof is connected to the puffing-down node; and a gate of the eleventh transistor is connected to the pulling-down node, a source thereof is connected to the low voltage signal terminal, and a drain thereof is connected to the output terminal.

5. The shift register unit according to claim 4, wherein the resetting unit comprises a twelfth transistor;

a gate of the twelfth transistor is connected to the second clock signal terminal, a drain thereof is connected to the low voltage signal terminal, and a source thereof is connected to the output terminal.

6. The shift register unit according to claim 1, wherein the first direct current signal has a phase opposite to that of the second direct current signal.

7. The shift register unit according to claim 1, wherein the first clock signal has a phase opposite to that of the second clock signal.

8. A gate driving circuit comprising multiple stages of shift register units according to claim 1; except for a first stage of shift register unit and a last stage of shift register unit, a first input signal of each stage of shift register is connected to an output terminal of an adjacent previous stage of shift register unit, a second input signal of each sage of shift register unit is connected to an output terminal of an adjacent next shift register unit, and an output terminal of each stage of shift register unit is connected to a second input signal terminal of the adjacent previous stage of shift register unit and a first input signal terminal of the adjacent next stage of shift register unit.

9. A display device comprising the gate driving circuit according to claim 8.

10. The gate driving circuit according to claim 9, wherein the output sub-circuit comprises a fifth transistor and a first capacitor;

a gate of the fifth transistor is connected to the pulling-up node, a drain thereof is connected to the first dock signal terminal, and a source thereof is connected to the output terminal; and one terminal of the first capacitor is connected to the pulling-up node, and another terminal of the first capacitor is connected to the low voltage signal terminal or the output terminal.

11. The gate driving circuit according to claim 10, wherein the pulling-down driving sub-circuit comprises a sixth transistor, a seventh transistor, an eighth transistor, a ninth transistor and a second capacitor;

a gate and a drain of the seventh transistor are connected to the first clock signal terminal, and a source thereof connected to a gate of the ninth transistor;

a drain of the ninth transistor is connected to the second clock signal terminal, and a source thereof is connected to a source of the eighth transistor;

a gate of the eighth transistor is connected to the second clock signal terminal, and the drain thereof is connected to the pulling-down node;

a gate of the sixth transistor is connected to the pulling-up node, a drain thereof is connected to the pulling-down node, and a source thereof is connected to the low voltage signal terminal; and one terminal of the second capacitor is connected to the low voltage signal terminal, and another terminal thereof is connected to the source of the seventh transistor.

12. The gate driving circuit according to claim 11, wherein the pulling-down sub-circuit comprises a tenth transistor and an eleventh transistor;

a drain of the tenth transistor is connected to the low voltage signal terminal, a source thereof is connected to the pulling-up node, and a gate thereof is connected to the pulling-down node; and a gate of the eleventh transistor is connected to the pulling-down node, a source thereof is connected to the low voltage signal terminal, and a drain thereof is connected to the output terminal.

13. The gate driving circuit according to claim 12, wherein the resetting unit comprises a twelfth transistor;

a gate of the twelfth transistor is connected to the second clock signal terminal, a drain thereof is connected to the low voltage signal terminal, and a source thereof is connected to the output terminal.

14. The display device according to claim 9, wherein the input sub-circuit comprises a first transistor, a second transistor, a third transistor and a fourth transistor;

a gate and a source of the first transistor are connected to the first input signal terminal;

a drain of the second transistor is connected to a drain of the first transistor, a gate thereof is connected to the first direct current signal terminal, and a source thereof is connected to the pulling-up node;

a gate and a source of the third transistor are connected to the second input signal terminal, and a drain thereof is connected to the pulling-up node; and a source of the fourth transistor is connected to the drain of the third transistor, a gate thereof is connected to the second direct current signal terminal, and a drain thereof is connected to the pulling-up node.

15. The display device according to claim 14, wherein the output sub-circuit comprises a fifth transistor and a first capacitor;

a gate of the fifth transistor is connected to the pulling-up node, a drain thereof is connected to the first clock signal terminal, and a source thereof is connected to the output terminal; and one terminal of the first capacitor is connected to the pulling-up node, and another terminal of the first capacitor is connected to the low voltage signal terminal or the output terminal.

16. The display device according to claim 15, wherein the pulling-down driving sub-circuit comprises a sixth transistor, a seventh transistor, an eighth transistor, a ninth transistor and a second capacitor;

a gate and a drain of the seventh transistor are connected to the first clock signal terminal, and a source thereof connected to a gate of the ninth transistor;

a drain of the ninth transistor is connected to the second clock signal terminal, and a source thereof is connected to a source of the eighth transistor;

a gate of the eighth transistor is connected to the second clock signal terminal, and the drain thereof is connected to the pulling-down node;

a gate of the sixth transistor is connected to the puffing-up node, a drain thereof is connected to the pulling-down node, and a source thereof is connected to the low voltage signal terminal; and one terminal of the second capacitor is connected to the low voltage signal terminal, and another terminal thereof is connected to the source of the seventh transistor.

17. The display device according to claim 16, wherein the pulling-down sub-circuit comprises a tenth transistor and an eleventh transistor;

a drain of the tenth transistor is connected to the low voltage signal terminal, a source thereof is connected to the pulling-up node, and a gate thereof is connected to the pulling-down node; and a gate of the eleventh transistor is connected to the pulling-down node, a source thereof is connected to the low voltage signal terminal, and a drain thereof is connected to the output terminal.

18. The display device according to claim 17, wherein the resetting unit comprises a twelfth transistor;

a gate of the twelfth transistor is connected to the second dock signal terminal, a drain thereof is connected to the low voltage signal terminal, and a source thereof is connected to the output terminal.

* * * * *